US007189098B1

(12) United States Patent
Wu

(10) Patent No.: US 7,189,098 B1

(45) Date of Patent: Mar. 13, 2007

(54) CABLE CONNECTOR ASSEMBLY AND METHOD OF MANUFACTURING THE SAME

(75) Inventor: Jerry Wu, Irvine, CA (US)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 11/323,769

(22) Filed: Dec. 30, 2005

(51) Int. Cl.
*H10R 13/627* (2006.01)

(52) U.S. Cl. ....................... 439/352; 439/371; 439/206

(58) Field of Classification Search ................ 439/352, 439/371, 206
See application file for complete search history.

(56) References Cited

U.S. PATENT DOCUMENTS

| | | | | |
|---|---|---|---|---|
| 5,779,495 | A * | 7/1998 | Dechelette et al. | 439/353 |
| 6,431,887 | B1 | 8/2002 | Yeomans et al. | |
| 6,585,536 | B1 | 7/2003 | Wu | |
| 6,585,537 | B1 | 7/2003 | Lee | |
| 6,655,979 | B1 | 12/2003 | Lee | |
| 6,821,139 | B1 | 11/2004 | Wu | |
| 6,830,472 | B1 | 12/2004 | Wu | |
| 6,843,678 | B2 * | 1/2005 | DeWitt et al. | 439/445 |
| 6,857,912 | B2 | 2/2005 | Wu | |
| 6,860,749 | B1 | 3/2005 | Wu | |
| 6,860,750 | B1 | 3/2005 | Wu | |
| 6,866,534 | B2 * | 3/2005 | Hirschmann | 439/352 |
| 6,890,205 | B1 | 5/2005 | Wu | |
| 6,896,540 | B1 | 5/2005 | Wu | |
| 6,918,782 | B2 * | 7/2005 | Foster | 439/352 |
| 6,926,553 | B2 | 8/2005 | Wu | |

OTHER PUBLICATIONS

"SFF-8087 Specification for Compact Multilane Unshielded Connector" Rev. 1.31, published on Jun. 27, 2005 by SFF Committee.

* cited by examiner

*Primary Examiner*—Truc Nguyen
(74) *Attorney, Agent, or Firm*—Wei Te Chung

(57) ABSTRACT

A cable connector assembly (100) includes a housing defining a mating direction, a first housing piece (1) with a mating interface (11) formed thereon and a second housing piece (2) attached to the first housing piece (1) along the mating direction, a printed circuit board (3) received in the housing, and defining a mating portion (30) accessible from the mating interface (11) of the first housing piece (1), a cable (4) attached to the printed circuit board (3), and a latch (6) attached with the housing for locking the cable connector assembly (100) with a complementary connector.

13 Claims, 9 Drawing Sheets

CABLE CONNECTOR ASSEMBLY AND METHOD OF MANUFACTURING THE SAME

CROSS-REFERENCE TO RELATED APPLICATION

This application is related to U.S. patent application Ser. No. 11/268,951 filed on Nov. 7, 2005, invented by Jerry Wu, entitled "CABLE CONNECTOR ASSEMBLY WITH INTEGRAL PRINTED CIRCUIT BOARD", which is assigned to the same assignee as this application.

BACKGROUND OF THE INVENTION

1. Field of the Invention

The present invention relates to a cable connector assembly and method of manufacturing the same, and more particularly to a cable connector assembly used for high-speed signal transmission.

2. Description of Related Art

A committee called SFF is an ad hoc group formed to address storage industry needs in a prompt manner. When formed in 1990, the original goals were limited to define de facto mechanical envelopes within disk drives can be developed to fit compact computer and other small products. Specification SFF-8087 defines physical interface and general performance requirements of the mating interface for a Compact Multilane Connector which is designed for using in high speed serial interconnect applications at speeds up to 10 Gigabits/second. The Compact Multilane Connector defined in the SFF-8087 comprises a printed circuit board, a plurality of high-speed cables and low-speed wires respectively electrically connected with the printed circuit board to form a plurality of junctions therebetween, a PVC housing overmolding to the printed circuit board and the cables. The PVC housing comprises a rectangular body portion enclosing the junctions and a pair of tongue portions respectively extending forwardly from the body portion. The front portion of the printed circuit board is exposed between the pair of tongue portions for electrically connecting with a complementary connector. The Compact Multilane Connector also comprises a latch member assembled to a top surface of the body portion of the housing for latching with the complementary connector.

However, over-molding the housing on the printed circuit board and the cables is complicated, and during a molding process, the melted plastic material may make the printed circuit board warp, thereby causing an electrical connection between the Compact Multilane Connector and the complementary connector unsteady. In addition, the pair of tongue portions of the housing are easy to suffer from exterior affection and therefore, causing the tongue portions to break, it is difficult to replace the housing conveniently, and maybe discard the whole Compact Multilane Connector as useless. The deficiency shown above is obvious, and should be solved. Furthermore, detailed structures of the connector are not provided, such as the connection between the printed circuit board and the housing, and the connector still has room to be improved for achieving perfect signal transmission effect or complying the requirements described in the SFF-8087 more coincidently.

Hence, an improved cable connector assembly is desired to address the problems stated above.

SUMMARY OF THE INVENTION

An object of the present invention is to provide a cable connector assembly to provide a reliable connection between parts thereof.

Another object of the present invention is to provide a cable connector assembly to replace parts of cable connector assembly conveniently and economically.

the third object of the present invention is to provide a method of massively manufacturing above cable connector assembly.

To achieve the above objects, a cable connector assembly in accordance with the present invention comprises a housing defining a mating direction, a first housing piece with a mating interface, and a second housing piece attached to the first housing piece, a printed circuit board received in the housing, and having a plurality of electrical pads formed thereon, and a mating portion accessible from the mating interface of the housing, a cable with a plurality of conductors electrically attached to the electrical pads of the printed circuit board.

More specifically, in one embodiment, the first housing piece is attached to the second housing piece reliably by exterior materials, such as glue, and/or other adhesive materials.

More specifically, in another embodiment, the first housing piece is detachably engaged with the second housing piece, and the first housing piece together with the second housing piece enclose the printed circuit board.

To achieve the object of massively manufacturing the cable connector assembly in accordance with the present invention, a method is comprises a serials of steps described as below, providing a motherboard with multi-piece printed circuit boards connecting with each other by connecting pieces, equipping each multi-piece printed circuit board with a plurality of conductive pads thereon, soldering a sets of cables to motherboard, with a plurality of conductors of the cables electrically attached to corresponding conductive pads, over-molding a sets of second housing pieces on corresponding multi-piece printed circuit boards and the cables, separating the connecting pieces from the motherboard, attaching a sets of first housing pieces to the sets of second housing pieces for together receiving the printed circuit board therein.

Other objects, advantages and novel features of the invention will become more apparent from the following detailed description when taken in conjunction with the accompanying drawings.

DETAILED DESCRIPTION OF THE INVENTION

Figure 1:
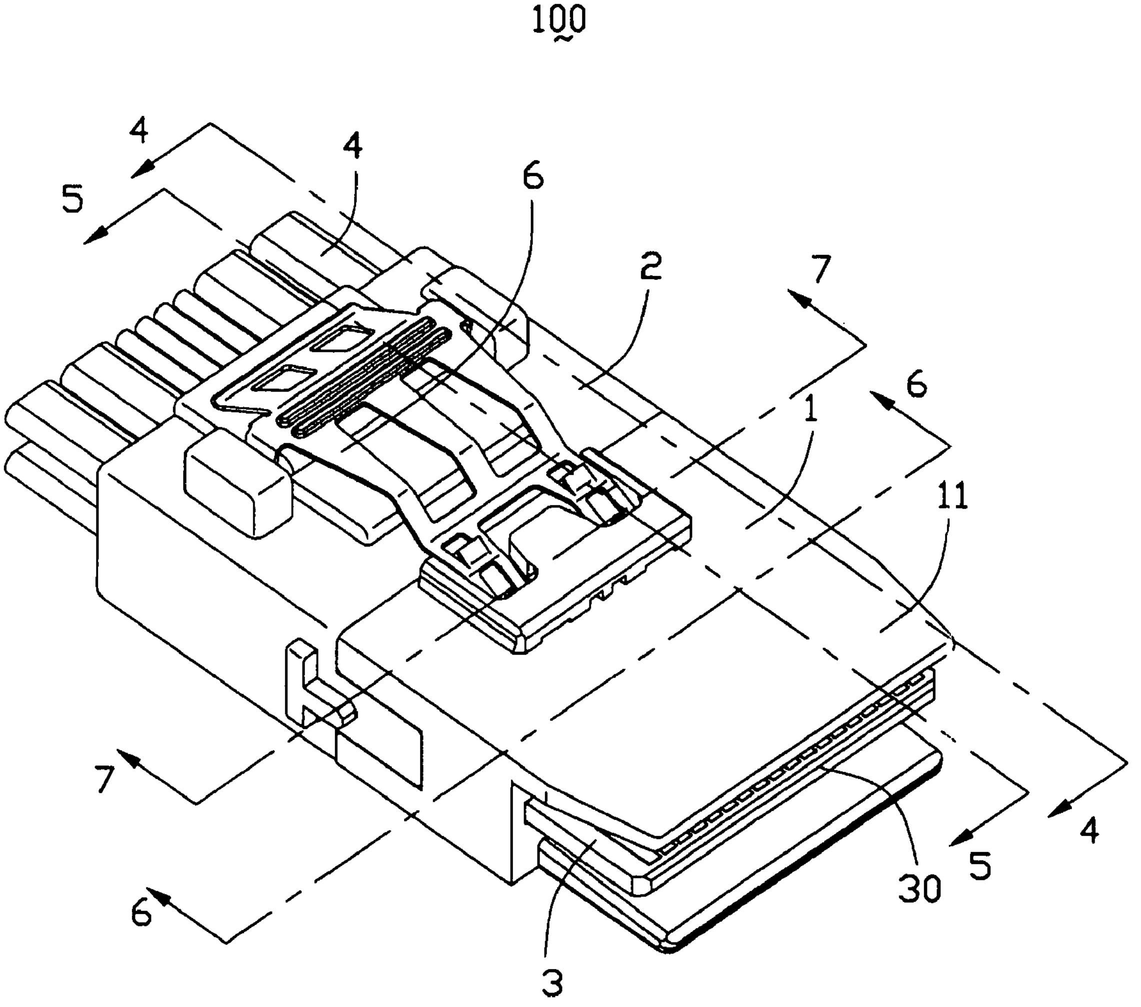
FIG. 1 is an assembled, perspective view of a cable connector assembly in accordance with the present invention.

Referring to FIG. 1, a cable connector assembly 100 in accordance with the present invention comprises a housing (not labeled) comprising a mating direction, a first housing piece 1 with a mating interface 11 formed thereon and a second housing piece 2 attached to the first housing piece 1 along the mating direction, a printed circuit board 3 received in the housing, and defining a mating portion 30 accessible from the mating interface 11 of the first housing piece 1, a cable 4 attached to the printed circuit board 3, and a latch 6 attached with the housing for locking the cable connector assembly 100 with a complementary connector (not shown).

Figure 2:
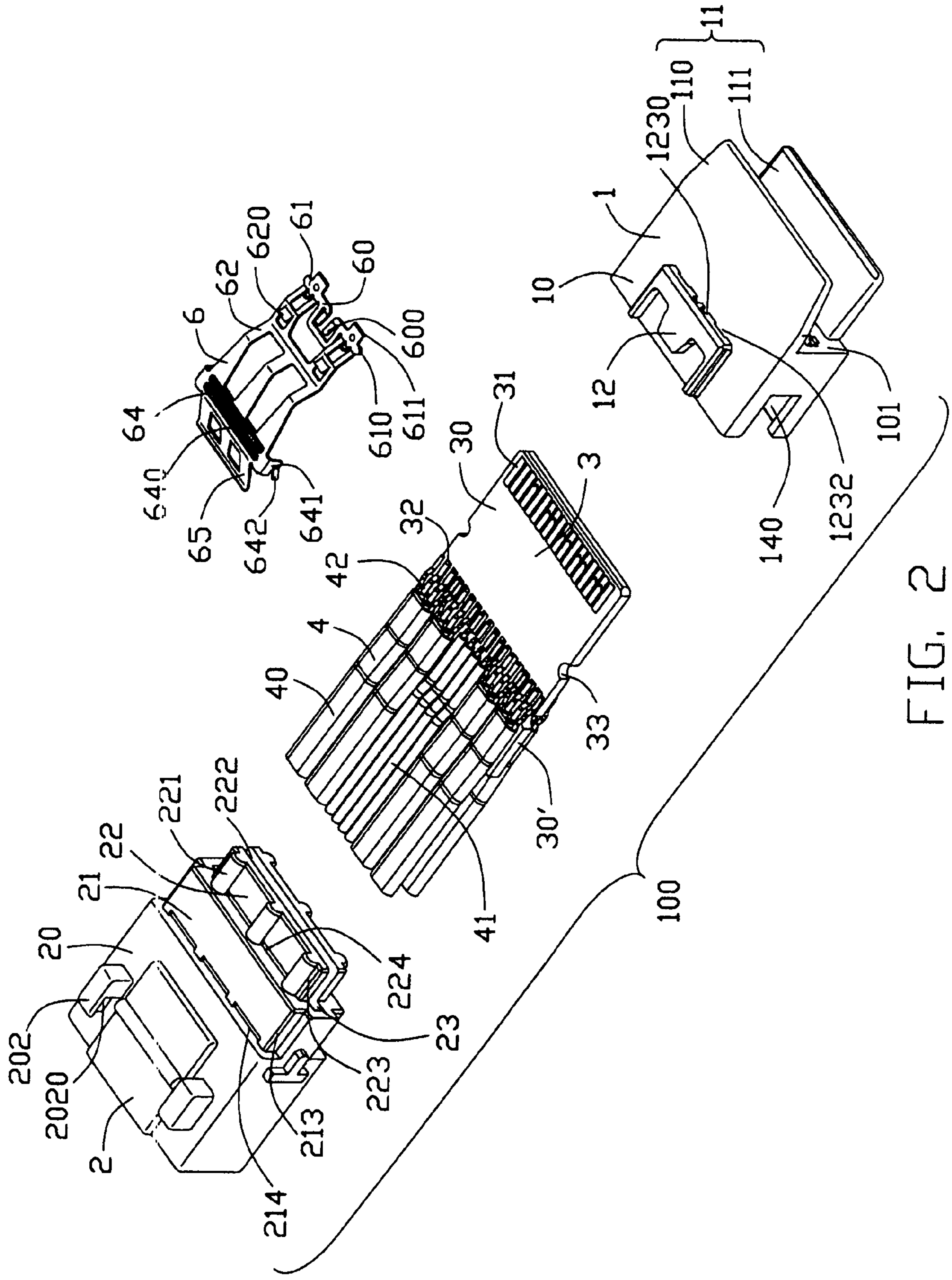
FIG. 2 is an exploded, perspective view of the cable connector assembly shown in FIG. 1.
Figure 3:
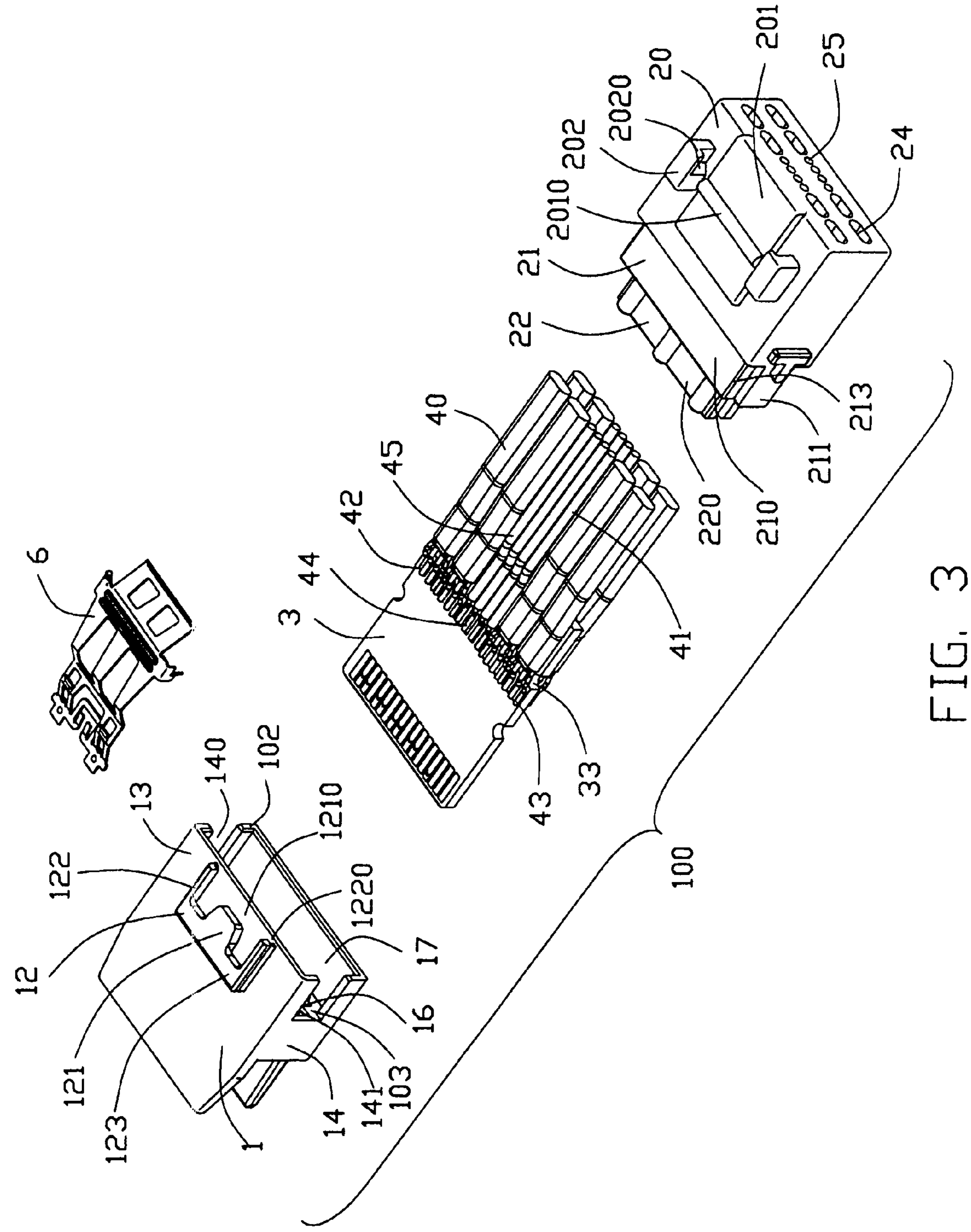
FIG. 3 is a view similar to FIG. 2 but taken from a different perspective.
Figure 5:
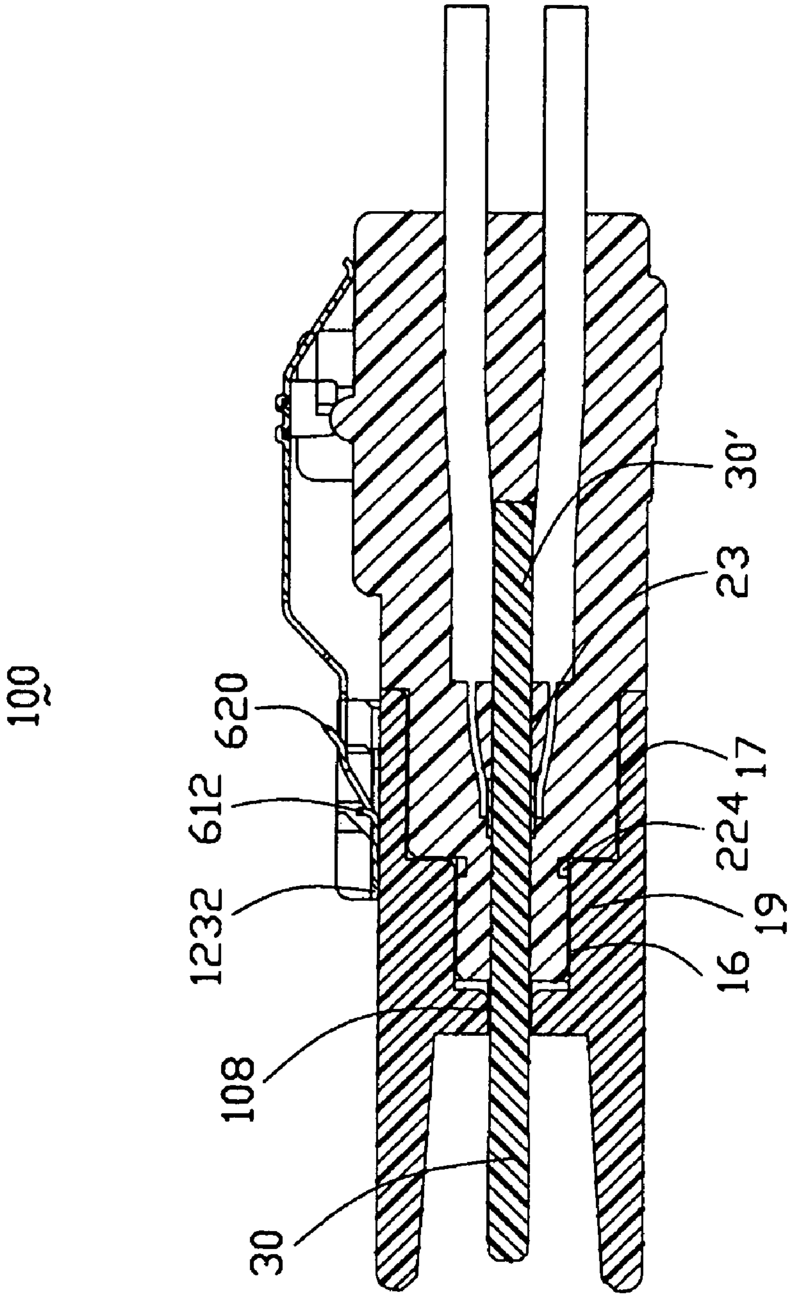
Figure 6:
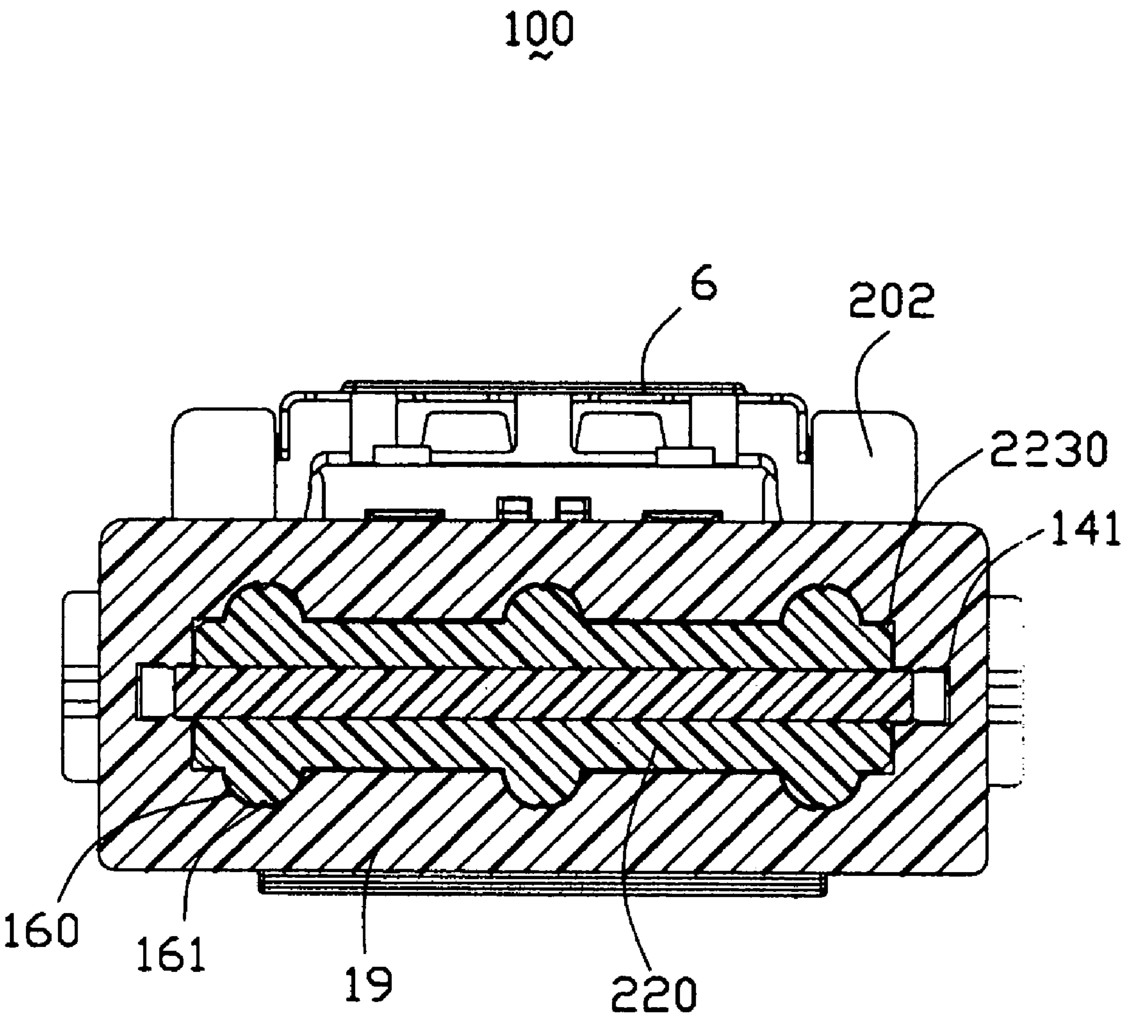
Figure 7:
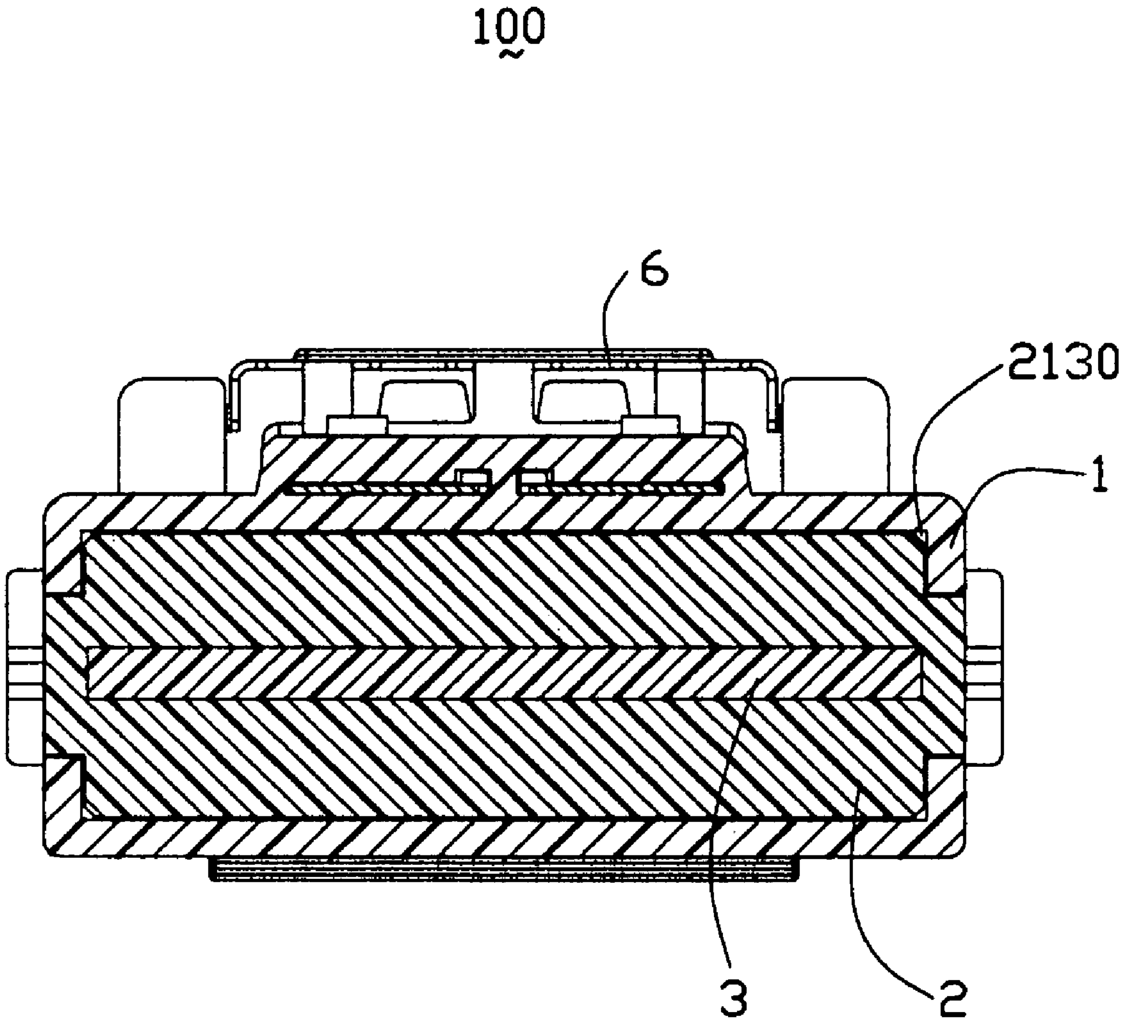

Referring to FIGS. 1–3 in conjunction with FIG. 5, the first housing piece 1 is made of insulative material with enough rigidity or other material, such as metal. The first housing piece 1 comprises a rectangular body portion 10 defining a central receiving slot 108 therethrough, and the mating interface 11 comprising first and second tongue sections 110 respectively extending forwardly from a front surface 101 of the body portion 10 and an opening 111 formed between the first and second tongue sections 110 along a first direction perpendicular to the mating direction.

Referring to FIGS. 3–6, the body portion 10 defines a rectangular first receiving recess 17 recessed forwardly a first distance from a rear surface 102 thereof, and thus, forming a pair of longitudinal walls 13, a pair of lateral walls 14, a front inner face 103, and a second receiving recess 16 recessed forwardly a second distance from the front inner face 103 and communicating with the receiving slot 108 and the first receiving recess 17 with a pair of step-shape pieces 19 stepped relative to corresponding longitudinal walls 13. Each step-shape piece 19 forms triple semi-circular holes 160 recessed inwardly from a top surface thereof, and a plurality of ribs 161 formed in the semi-circular holes 160 for providing a reliable grasp. At two sides of the receiving slot 108 along the first direction, there form triple rectangular channels 163 communicating with corresponding semi-circular holes 160 respectively. Each lateral wall 14 defines a guiding cut 140 depressed forwardly the first distance from the rear surface 102 of the body portion 10, a guiding slot 141 communicating with the receiving slot 108 and the second receiving recess 16 for guiding the printed circuit board 3 to be inserted in. Noticeably, a length of the guiding slot 141 along the mating direction is equal to a total length of the second receiving recess 16 and the receiving slot 108.

Figure 4:
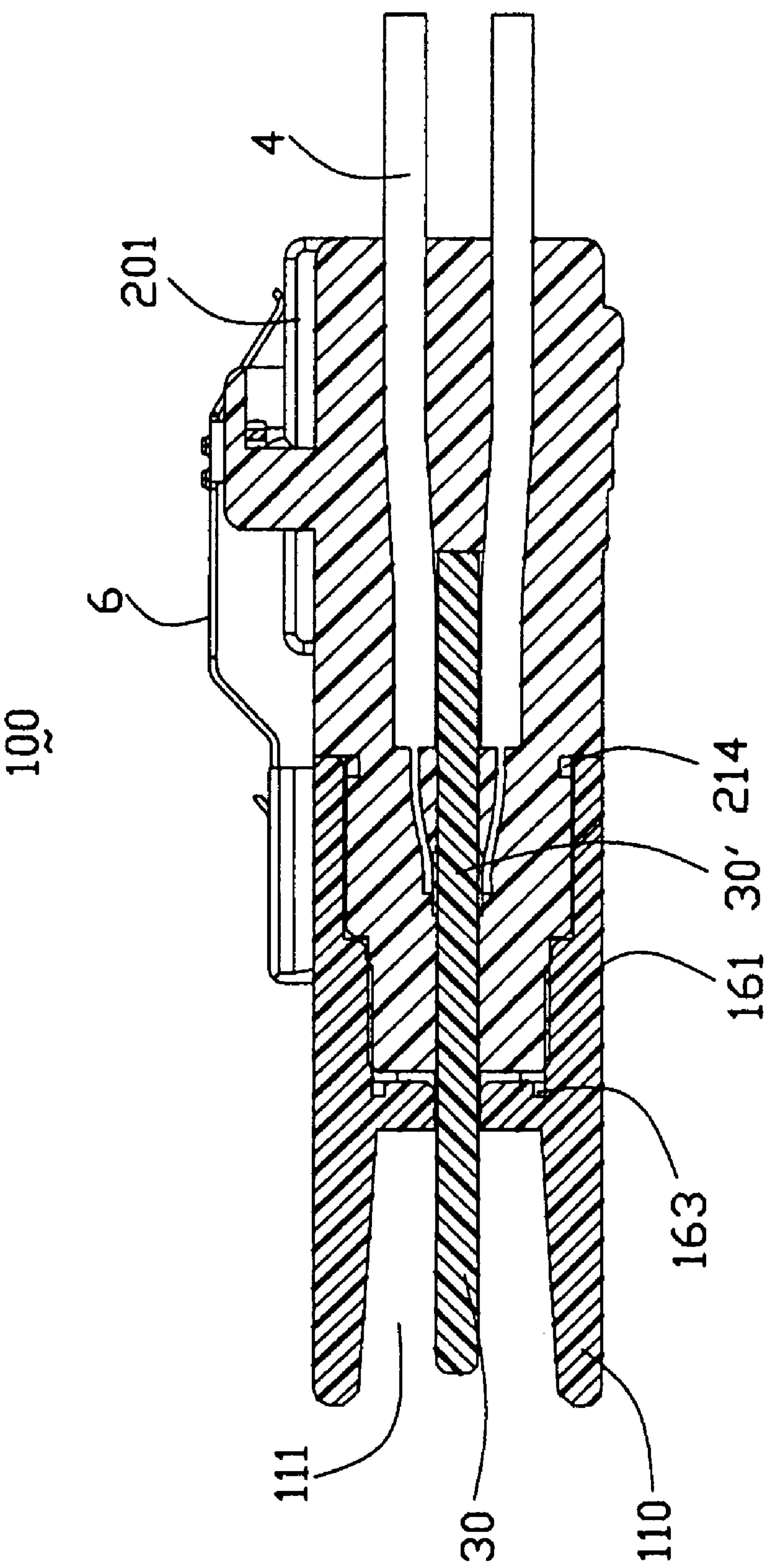
FIGS. 4–7 are cross-section views taken along lines 4—4 to 7—7 of FIG. 1.

Referring to FIGS. 2–3 in conjunction with FIGS. 4–5, the body portion 10 forms an M-shape engaging portion 12 on a top surface and adjacent to the rear surface 102 thereof. The engaging portion 12 comprises a protruding section 121 and a pair of arms 122 located at opposite sides of the protruding section 121, all extending rearward from a transverse main section 123. A slit 1210 is formed between the protruding section 121 and a top surface of the body portion 10 and extends into the main section 123. A pair of grooves 1220 is respectively formed in the arms 122 and open toward each other. A pair of first slots 1230 and a pair of second slots 1232 located at opposite outer sides of the first slots 1230 are recessed from a front surface of the main section 123 to communicate with the slit 1210, respectively.

Referring to FIGS. 2–7, the second housing piece 2 of the present invention is made of PVC material. In other embodiments, the second housing piece 2 also can be made from other material, same as that of the first housing piece 1 or different from that of the first housing piece 1. The second housing piece 2 comprises a main portion 20, a first holding portion 21 stepped relative to and forwardly projecting from the main portion 20, and a second holding portion 22 stepped relative to and forwardly projecting from the first holding portion 21. The main portion 20 forms a flat extruding section 201 protruding upwardly from an upper surface thereof, and a pair of ear sections 202 located at opposite sides of the extruding section 201. The extruding section 201 forms a transverse bar-shape pivot section 2010 on middle thereof. A pair of recesses 2020 is respectively formed between the top surface of the main portion 20 and the pair of ear sections 202 with opening toward each other. The first holding portion 21 forms a base 210 of generally rectangular structure and received in the first receiving recess 17, a pair of guiding projections 211 on opposite sides of the base 210 for located in the guiding cuts 140, and two pair of first tapered corners 213 formed on corresponding edges of the base 210. The second holding portion 22 comprises a pair of tongue pieces 220 opposite to each other, and an interspace 222 defined between the tongue pieces 220 and enough to allow the printed circuit board 3 extending through. Each second tongue piece 220 comprises triple semi-circular projectings 221 aligned with corresponding semi-circular holes 160 in mating direction, and a pair of second tapered corners 223 formed on lateral edges thereof. The second housing piece 2 further defines a receiving channel 23 in a middle thereof to communicate with the interspace 222 for receiving the printed circuit board 3 therein, and a plurality of first and second cable passageways 24, 25 communicating to the receiving channel 23 for allowing the cable 4 extending though. There form a plurality of first notches 214 adjacent to the junction between the main portion 20 and the first holding portion 21, and inwardly recessed a distance from upper and lower surfaces of the first holding portion 21. Similarly, there also form a plurality of second notches 224 adjacent to the junction between the first holding portion 21 and the second holding portion 22, and inwardly recessed a distance from upper and lower surfaces of the tongue pieces 220 of the second holding portion 22.

Referring to FIG. 2, the printed circuit board 3 defines a mating portion 30, and a rear portion 30' integrally attached to the mating portion 30 along the mating direction, and forms a plurality of first conductive pads 31 at the mating portion 30 thereof and a plurality of second conductive pads 32 at the rear portion 30' thereof for providing signals transmission to the first conductive pads 31 by a plurality of conductive traces (not shown) attaching the first conductive pads 31 towards the second conductive pads 32. The conductive pads 31, 32 are arranged on opposite upper and lower surfaces of the printed circuit board 3. In addition, the printed circuit board 3 further comprises two pairs of semi-circular cuts 33 spaced arranged at two lateral sides thereof.

Referring to FIG. 2, the cables 4 consist of two sets of sub-assemblies in a stacked relationship. Each set comprises four first cables 40 for high-speed signal transmission and four second cables 41 for low-speed signal transmission. Each first cable 40 comprises a pair of signal conductors 42 respectively transmitting positive signal and negative signal, and a pair of grounding conductors 43 arranged at opposite outer sides of the pair of signal conductors 42 for providing grounding to the signal transmission. Each second cable 41 comprises a single conductor 44 and a jacket 45 enclosing the single conductor 44.

Referring to FIGS. 2–3 in conjunction with FIG. 5, the latch 6 is stamped and formed from a metallic plate and comprises a retaining portion 60 of generally rectangular shape with a pair of elastic snapping sections 600 upwardly and rearwardly extending from one side thereof, a pair of generally T-shape positing portions 61 connecting with two lateral sides of the retaining portion 60, a pair of generally L-shape locking portions 62 upwardly and rearwardly extending from and stepped relative to the positing portions 61 respectively, a pressing portion 64 rearwardly extending from the locking portion 63, and an inclined supporting portion 65 slantwise and downwardly extending from the pressing portion 64. Each positing portion 61 comprises a protrusive piece 610 aligned with corresponding second slot 1232, a bar piece 611 for arranged within corresponding groove 1220, and a stop piece 612 upwardly extending therefrom for abutting against a inner surface of second slot 1232 and preventing the latch 6 from moving forwardly excessively. Each locking portion 62 is cantilevered relative to the positing portion 61 and comprises a locking barb 620 for detachably locking the cable connector assembly 100 with the complementary connector. The pressing portion 64 comprises a plurality of ribs 640 for facilitating handling, and a pair of side beams 641 extending from opposite lateral sides thereof with each side beam 641 defining a spring tab 642 for locking with the corresponding recess 2020 of the ear section 202.

Referring to FIGS. 1–7, in assembly of the cable connector assembly 100, the two sets of cables 4 are respectively soldered to the printed circuit board 3 with the first and second cables 40, 41 electrically soldered with corresponding second conductive pads 32 located on the upper and lower surfaces of the printed circuit board 3. Then, over-molding the second housing piece 2 with the printed circuit board 3 and the cables 4. The rear portion 30' of the printed circuit board 3 is integrally received in the interspace 222 and the receiving channel 23, the first and second cables 40, 41 are respectively and integrally received in corresponding first and second cable passageways 24, 25. During this over-molding process, the melted plastic material flows into two pairs of semi-circular cuts 33, after cooling, reliably engages with the semi-circular cuts 33 for achieving a reliable connection between the second housing piece 2 and the printed circuit board 3.

Next, in one embodiment, providing glue and/or other adhesive materials on the upper and lower surfaces of the first and second holding portions 21, 22, with excessive glue and/or other adhesive materials flowing into the first and second notches 214, 224. Then, inserting the second housing piece 2 with the printed circuit board 3 and the cables 4 attached therewith into the first housing piece 1 along the mating direction, because of a guiding by the guiding slots 141 of the first housing piece 1, the mating portion 30 of the printed circuit board 3 extends through the first and second receiving recesses 17, 16, and is accessible from the opening 111 of the mating interface 11 of the first housing piece 1 and restrictedly located in the first housing piece 1 by the receiving slot 108, the second holding portion 22 are received in the second receiving recess 16 with triple semi-circular projectings 221 reliably received in corresponding semi-circular holes 160 of the receiving recess 16, the first holding portion 21 are received in the first receiving recess 17 with the guiding projections 211 restrictedly located in corresponding guiding cuts 140 respectively. After this inserting process, the first and second slants 213, 223 of the first and second holding portions 21, 22 together with the inner surfaces of the first housing piece 1 form a plurality of first and second triangular cuts 2130, 2230 for receiving excessive glue and/or other adhesive materials. Similarly, the rectangular channels 163 formed communicating with semi-circular holes 160 respectively also can receive excessive glue and/or other adhesive materials alternatively. By means of the glue and/or other adhesive materials, the first housing piece 1 reliably attaches with the second housing piece 2.

In another embodiment of present invention, detachably mating the second housing piece 2 with the first housing piece 1. For achieving this goal, one of the first housing piece 1 and the second housing piece 2 forms at least a locking barb (not shown). Relatively, the other of the first housing piece 1 and the second housing piece 2 forms at least a locking hole (not shown). The locking barb can detachably mate with the locking hole for detachably attaching the second housing piece 2 to the first housing piece 1. Accidentally, the first housing piece 1 is broken, a user can replace it conveniently by means of this design, rather than discard the whole product as useless.

Particularly referring to FIGS. 1–5, the latch 6 is assembled to the first and second housing pieces 1, 2. A forward pressing force is exerted on the latch 6. The retaining portion 60 slides into the slit 1210 with the pair of elastic snapping section 600 respectively abutting against the inner surfaces of the first slots 1230 for achieving a reliable connection. The T-shape positing portions 61 respectively are pushed into the second slots 1232 respectively with the protrusive pieces 610 located in corresponding second slots 1232, the bar pieces 611 arranged within corresponding grooves 1220, and the stop pieces 612 abutting against a rear surface of the second slots 1232 for preventing the latch 6 from being inserted excessively and attaching the latch 6 with the first housing piece 1 reliably. The spring tabs 642 of the pressing portion 64 respectively slide into the ear sections 202 and resiliently attached with recesses 2020 for locking the latch 6 with the second housing piece 2 and preventing the latch 6 loosing from the second housing piece 2. Because the locking portion 62 of the latch 6 is cantilevered relative to the posting portion 61 and spaced a distance with the upper surface of the first housing piece 1, a user can exert a downward force on the pressing portion 64 to drive the locking portion 62 to move downwardly, thereby causing the locking barb 620 of the locking portion 62 to lock with corresponding holes of the complementary connector by means of a restorative force of the locking portion 62 when in a mating condition between the cable connector assembly 100 and the complementary connector. When in an unmating condition between the cable connector assembly 100 and the complementary connector, the user can exert a downward force on the pressing portion 64 to drive the locking portion 62 to separate from corresponding holes of the complementary connector, then, pull the cable connector assembly 100 directly.

Figure 8:
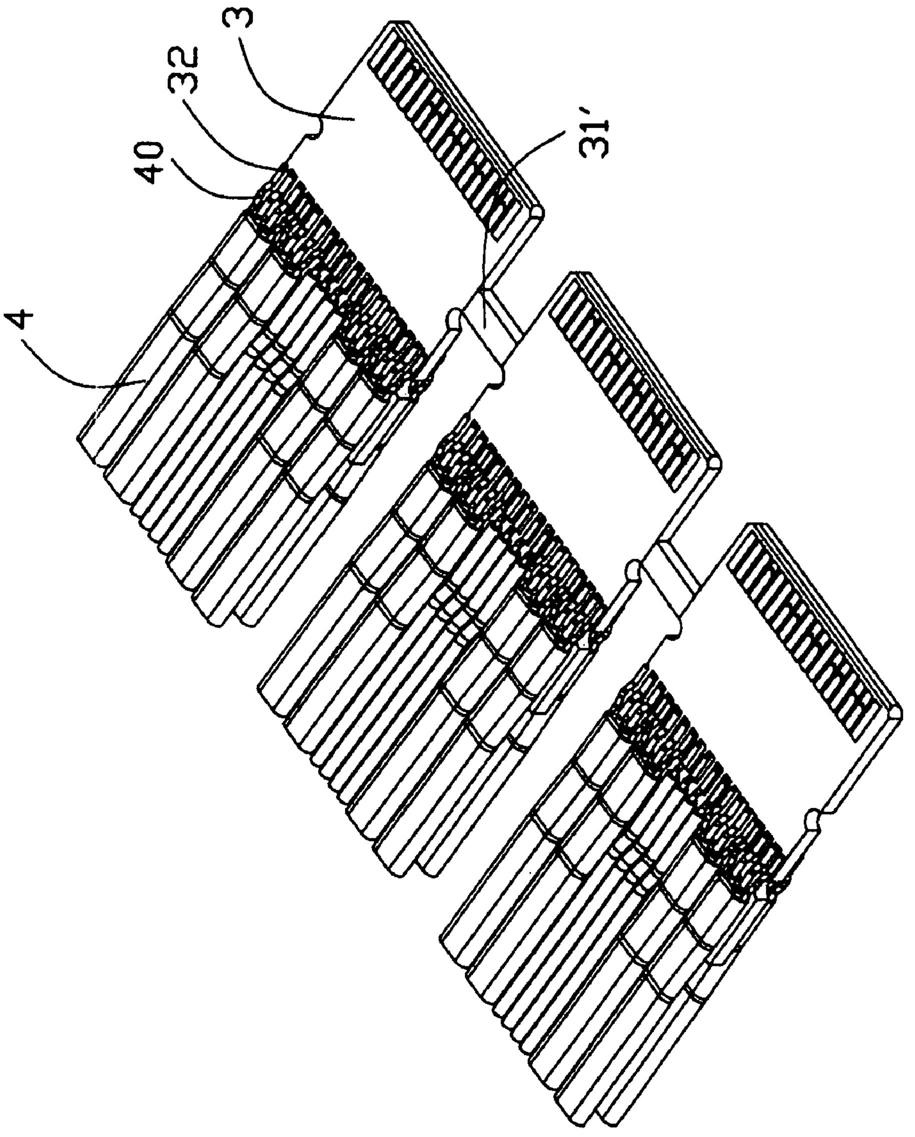
FIG. 8 is a perspective view of a sets of the printed circuit boards of the cable connector assemblies with the cables soldered therewith in accordance with the present invention.
Figure 9:
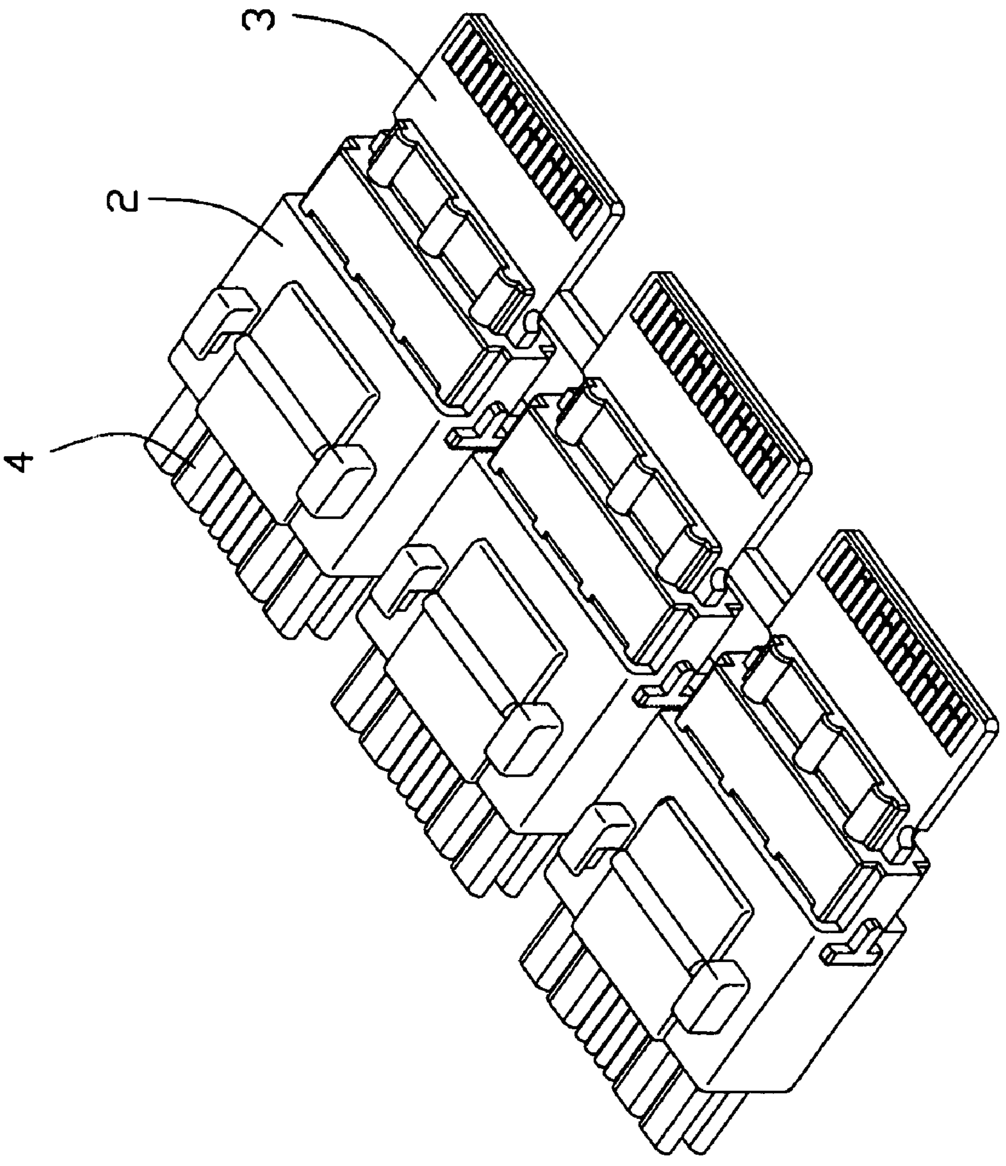
FIG. 9 is a partially, perspective view of the cable connector assemblies with a sets of second housing pieces over-molded with the printed circuit boards and the cables in accordance with the present invention.

Referring to FIGS. 8–9 in conjunction with FIG. 2, for manufacturing the cable connector assembly 100 in a batch manner, a method is provided and introduced as below. First, providing a motherboard (not shown) with multi-piece printed circuit boards 3 arranged side by side and connecting with one another by connecting pieces 31', the printed circuit board 3 with a plurality of conductive pads 32 thereon is similar to the printed circuit board 3 and introduced above. Then, soldering a sets of cables 4 to the motherboard, with a plurality of conductors 40' of cables 4 electrically attached to corresponding conductor pads 32'. Over-molding a set of second housing pieces 2 with the multi-piece printed circuit boards 3 and the cables 4 for enclosing a rear portion of the printed circuit boards 3 and the front ends of the cables 4. Next, separating the connecting pieces 31' from the motherboard and achieving a set of assemblies. Last, providing a set of first housing pieces 1 to attach with the sets of second housing pieces 2 for together receiving the multi-piece printed circuit boards 3 therein. In addition, a plurality of steps, for example, adding the glue and/or other adhesive materials on one of the first housing pieces 1 or second housing pieces 2, providing a latch 6 on one of the first housing piece 1 or second housing piece 2, are obvious by means of above description to the cable connector assembly 100 for a person with ordinary skill in this art.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cable connector assembly for mating with complementary connector, comprising:

a housing defining a mating direction, a first housing piece with a mating interface formed thereon, and a second housing piece assembled to the first housing piece;

a printed circuit board received in the housing, and having a plurality of electrical pads formed thereon, and a mating portion accessible from the mating interface of the housing; and a cable with a plurality of conductors electrically attached to the electrical pads of the printed circuit board;

wherein the mating interface defines two tongue sections opposite to each other and an opening formed between these two tongue sections along a direction perpendicular to the mating direction, the mating portion of the printed circuit board is posited in the opening;

wherein the cable comprises a plurality of first cable, and a plurality of second cables, the second cables is arranged between the first cables;

wherein the printed circuit board is wholly received in the housing, and integrally molded with the second housing piece.

2. The cable connector assembly as claimed in claim 1, wherein said printed circuit board is essentially connected to another printed circuit board, which is used with another cable connector assembly having a similar configuration with the cable connector assembly, via an interconnection device in a parallel relation, while said interconnection device is removed from both said printed circuit boards after said printed circuit board and the rear housing are assembled together.

3. The cable connector assembly as claimed in claim 1, wherein the first housing piece is detachably engaged with the second housing piece.

4. The cable connector assembly as claimed in claim 1, wherein the cable connector assembly further comprises a latch attached with the housing for detachably attaching the cable connector assembly to the complementary connector.

5. The cable connector assembly as claimed in claim 1, wherein the first housing piece is assembled to the second housing reliably by exterior material.

6. The cable connector assembly as claimed in claim 5, wherein the exterior material is glue and/or other adhesive materials, the exterior material is provided on one of the first housing piece and the second housing piece.

7. The cable connector assembly as claimed in claim 6, wherein one of the first housing piece and second housing piece comprises a notch for receiving excessive exterior material.

8. The cable connector assembly as claimed in claim 6, wherein the first housing piece comprises a receiving recess, and the second housing comprises a holding portion, the holding portion is received in the receiving recess for attaching the second housing piece to the first housing piece.

9. The cable connector assembly as claimed in claim 8, wherein the holding portion comprises a notch depressed from one surface thereof for receiving excessive material therein.

10. The cable connector assembly as claimed in claim 8, wherein the holding portion comprise a corner formed one edge thereof, the slant together with an inner surface of the receiving recess form a cut for receiving excessive material.

11. The cable connector assembly as claimed in claim 8, wherein the holding portion of the second housing piece comprises a projecting, and the receiving recess comprises a hole, the projecting is received in the hole.

12. The cable connector assembly as claimed in claim 11, wherein the first housing piece comprises a rectangular cut communicating with the semi-circular hole for receiving exterior material therein.

13. The cable connector assembly as claimed in claim 3, wherein one of the first housing and the second housing comprises a locking barb, the other of the first housing and the second housing comprises a locking hole, the locking barb detachably locks with the locking hole for detachably attaching the first housing piece to the second housing piece.

* * * * *